US011804357B2

(12) United States Patent
Mohammadi-Gheidari et al.

(10) Patent No.: US 11,804,357 B2
(45) Date of Patent: Oct. 31, 2023

(54) ELECTRON OPTICAL MODULE FOR PROVIDING AN OFF-AXIAL ELECTRON BEAM WITH A TUNABLE COMA

(71) Applicant: FEI Company, Hillsboro, OR (US)

(72) Inventors: Ali Mohammadi-Gheidari, Eindhoven (NL); Peter Christiaan Tiemeijer, Eindhoven (NL); Alexander Henstra, Hillsboro, OR (US); Tomas Radlicka, Eindhoven (NL)

(73) Assignee: FEI Company, Hillsboro, OR (US)

( * ) Notice: Subject to any disclaimer, the term of this patent is extended or adjusted under 35 U.S.C. 154(b) by 26 days.

(21) Appl. No.: 17/490,522

(22) Filed: Sep. 30, 2021

(65) Prior Publication Data

US 2023/0101108 A1    Mar. 30, 2023

(51) Int. Cl.
*H01J 37/153*    (2006.01)
*H01J 37/145*    (2006.01)
*H01J 37/147*    (2006.01)
*H01J 37/28*    (2006.01)

(52) U.S. Cl.
CPC .......... *H01J 37/153* (2013.01); *H01J 37/145* (2013.01); *H01J 37/1471* (2013.01); *H01J 37/28* (2013.01); *H01J 2237/0453* (2013.01); *H01J 2237/1532* (2013.01); *H01J 2237/1534* (2013.01)

(58) Field of Classification Search
CPC .. H01J 37/00; H01J 37/02; H01J 37/26; H01J 37/28; H01J 37/153; H01J 37/145; H01J 37/1471; H01J 2237/0453; H01J 2237/1532; H01J 2237/1534
USPC .............................. 250/396 R, 306, 307, 311
See application file for complete search history.

(56) References Cited

U.S. PATENT DOCUMENTS

2005/0253083 A1* 11/2005 Sato ................... H01J 37/153
                                                          250/398
2010/0065753 A1*  3/2010 Enyama ............... H01J 37/153
                                                          250/397

* cited by examiner

*Primary Examiner* — Jason L McCormack

(57) ABSTRACT

An electron optical module for providing an off-axial electron beam with a tunable coma, according to the present disclosure includes a structure positioned downstream of an electron source and an electron lens assembly positioned between the structure and the electron source. The structure generates a decelerating electric field, and is positioned to prevent the passage of electrons along the optical axis of the electron lens assembly. The electron optical module further includes a micro-lens that is not positioned on the optical axis of the electron lens assembly and is configured to apply a lensing effect to an off-axial election beam. Aberrations applied to the off-axial electron beam by the micro-lens and the electron lens assembly combine so that a coma of the off-axial beam has a desired value in a downstream plane.

19 Claims, 6 Drawing Sheets

ELECTRON OPTICAL MODULE FOR PROVIDING AN OFF-AXIAL ELECTRON BEAM WITH A TUNABLE COMA

BACKGROUND OF THE INVENTION

The magnification and resolution of microscopes need to be continuously improved in order to enable scientists and engineers continue to explore and develop technologies at an increasingly smaller level. To achieve this, microscope components are continuously improved to increase microscope performance (i.e., increase resolution, increase magnification, reduce aberrations, etc.). Two of the fundamental aberrations that need to be corrected within a charged particles system is spherical aberration ($C_S$) and coma. As per the Scherzer theorem, the electromagnetic lenses used to focus the electron beams in electron microscopes always have a positive spherical aberration coefficient. This means that charged particle systems employing such electromagnetic lenses have been understood to have unavoidable imaging errors, or need to be supplemented with additional correctors which can be difficult to manufacture, require dynamic adjustment/maintenance, and greatly increase the overall cost of the SEM/STEM systems.

SUMMARY

An electron optical module for providing an off-axial electron beam with a tunable coma, according to the present disclosure includes a structure positioned downstream of an electron source when used in a charged particle system, an electron lens assembly positioned between the structure and the electron source when used in a charged particle system, and a micro-lens that is not positioned on the optical axis of the electron lens assembly and which applies a lensing effect to an off-axial election beam that does not travel along the optical axis of the electron lens assembly. The structure may be configured to have a voltage potential applied to it when the electron lens is in use, and is positioned such that the structure prevents the passage of electrons along an optical axis of the electron lens assembly. First aberrations applied to the off-axial electron beam by the micro-lens combines with second aberrations applied by the electron lens assembly such that the off-axial beam has a desired value of off-axial aberrations, especially a desired value of coma in a plane downstream of the electron lens. In some embodiments, through the process of adjusting one or more of the size, design, position, and voltages applied for individual electron lens assembly components, the electron lens may be tuned to adjust the contribution to the off-axial electron beam of one or more of spherical aberration, coma, field curvature, and/or astigmatism such that a desired amount of spherical aberration, coma, field curvature, and/or astigmatism is present at one or more downstream planes.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicate similar or identical items.

Figure 1:
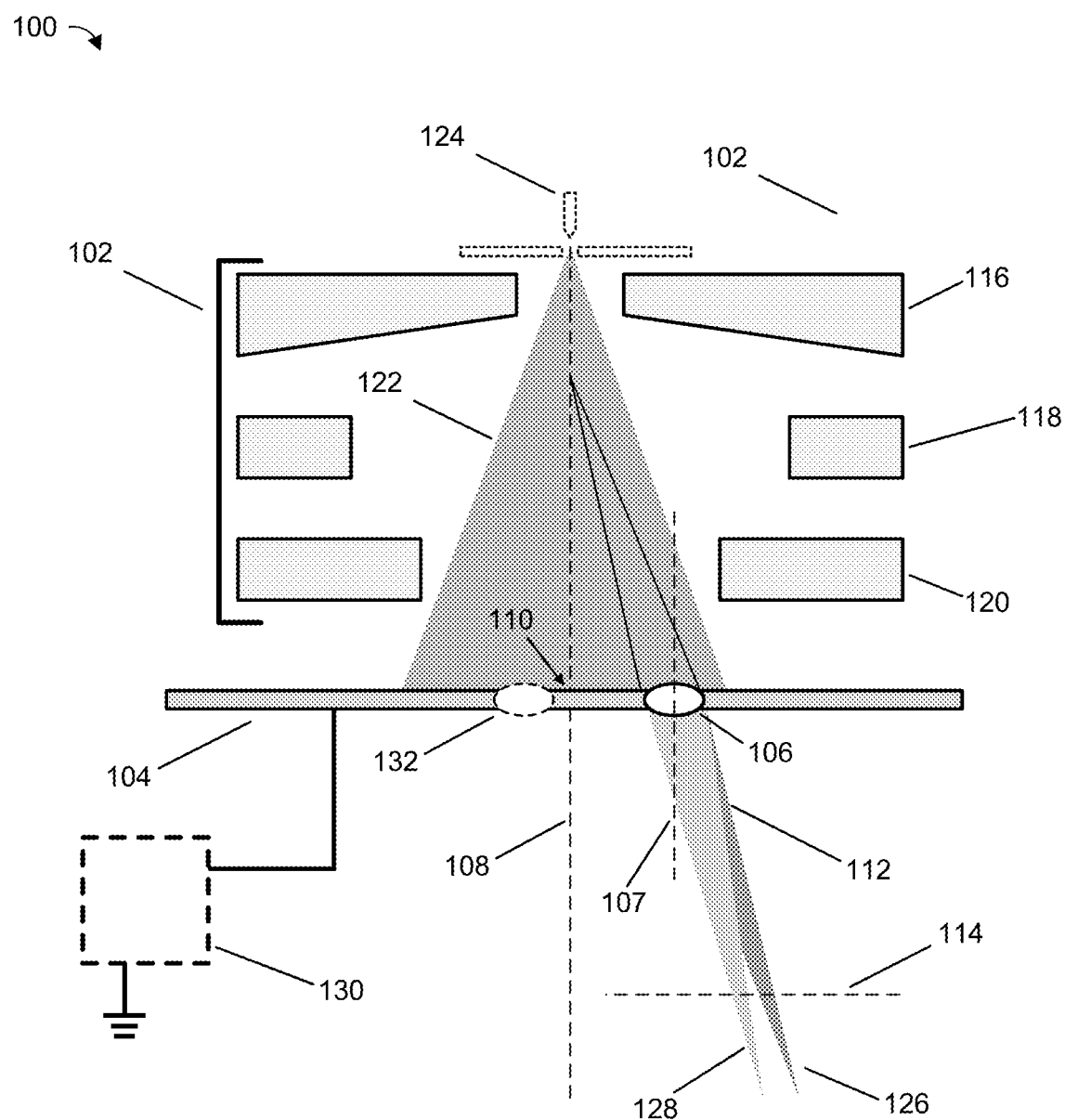
FIG. 1 illustrates an example electron optical module for providing an off-axial electron beam with a tunable coma.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Systems including an electron optical module for providing an off-axial electron beam with a tunable coma, are disclosed herein. More specifically, the systems according to the present disclosure include a structure (e.g., a foil, an aperture plate, etc.) positioned downstream of an electron source when used in a charged particle system, an electron lens assembly positioned between the structure and the electron source when used in a charged particle system, and a micro-lens that is not positioned on the optical axis of the electron lens assembly and which applies a lensing effect to an off-axial electron beam that does not travel along the optical axis of the electron lens assembly. The structure is configured to have a voltage potential applied to it when the electron optical module is in use, and is positioned such that the structure prevents the passage of electrons along the optical axis of the electron lens assembly. The voltage applied to the structure is such that, in conjunction with the voltages on the electron lens assembly, it creates an electric field that decelerates the electrons towards this structure. As per the Scherzer theorem, the total spherical aberration from source to sample must be positive, but because of the decelerating field, the spherical aberration contributed by the region from source to structure can be negative. This negative contribution to the spherical aberration can be used to effectively compensate off-axial aberrations: According to the present invention, first aberrations applied to the off-axial electron beam by the micro-lens combines with second aberrations applied by the electron lens assembly such that the coma aberration of the off-axial beam has a desired value in a plane downstream of the electron lens. In various embodiments, the dimensions, layout, and voltages of the components of the electron optical module may further be configured such that the first and second aberrations also correct for spherical aberration ($C_S$), and/or field curvature, and/or astigmatism. Additionally, in some embodiments of the present disclosure, the electron optical module of the present disclosure may be a component portion of a coma correction system and/or a monochromator.

FIG. 1 is an illustration of an example electron optical module 100 for providing an off-axial electron beam with a tunable coma. The optical module 100 is illustrated as comprising an electron lens assembly 102, a structure 104, and an off-axial micro-lens 106. The structure 104 is shown as being positioned downstream of the lens assembly 102 when used in a charged particle system. In some embodiments, the structure blocks the path of electrons traveling along the optical axis 108 of the lens assembly. When the electron optical module 100 is in use, a voltage potential is applied to at least the upper surface of the structure 104. In some embodiments, the structure 104 holds a charge such that a charge 110 is present at the optical axis 108. The micro-lens 106 is positioned off the optical axis 108 of the lens assembly 102 and is configured to apply a lensing effect to an off-axial electron beam 112. The off-axial electron beam 112 corresponds to a portion of the electrons 122 that do not travel along the optical axis 108 of the electron lens assembly 102. Additionally, in some embodiments of the present invention the off-axial electron beam 112 travels through the micro-lens 106 along a path that is different from the optical axis 107 of the micro-lens 106. In this way, the off-axial electron beam 112 receives contributions of aberrations from both the electron lens assembly 102 and the micro-lens 106. The optical axis of an electron lens is known to one skilling in the art to be an imaginary straight line passing through the center(s) of the lens(es) and/or the center of the electric field generated by the lens(es). A person having skill in the art would understand that a portion of an electron beam that does not pass through an electron lens along its optical axis will have one or more off-axial aberrations (e.g., coma, field curvature, astigmatism, etc.) applied to it by the electron lens.

In embodiments of the present invention, the combined contribution of the electron lens assembly 102 to the coma of the off-axial beam 112 and contribution of the micro-lens 106 to the coma of the off-axial beam 112 cause the off-axial electron beam 112 to have a desired coma in a plane 114 downstream of the electron lens when used in a charged particle system. Alternatively, the combined contributions to the coma from the lens assembly 102 and the micro-lens 106 may further combine with the aberrations of other optical elements in a charged particle system so that the net coma of the off-axial electron beam 112 is zero (or near zero) in a plane downstream of the electron optical module 100 (e.g., the sample plane). Additionally, to in some embodiments of the present invention, the lens assembly 102 may be configured to apply a negative spherical aberration ($C_S$) to the off-axial electron beam 112, and the micro-lens 106 may be configured to apply a positive spherical aberration to the off-axial electron beam 112.

In addition, in some embodiments the contribution of off-axial aberrations by the electron lens assembly 102 may compensate and/or negate other aberrations in the micro-lens 106 (or the cumulative aberrations from other elements in the system), including astigmatism, field curvature, etc. For example, the negative spherical aberration of the electron lens assembly 102 may contribute to an astigmatism effect that compensates an astigmatism effect of the micro-lens 106 such that the off-axial electron beam 112 has no astigmatism in a plane downstream of the electron optical module 100.

According to the present invention, by adjusting the dimensions, layout, positions, and voltages of the components of the electron optical module 100 the contributions of the lens assembly 102 and/or the micro-lens 106 to individual ones of coma, astigmatism, field curvature can be changed to a desired value. In this way, the electron optical module 100 can be tuned so that these contributions combine to cause the off-axial electron beam 112 to have a desired value of coma, astigmatism, field curvature in one or more planes downstream of the electron optical module 100. That is, by adjusting the dimensions, layout, positions, and voltages of the components of the electron optical module 100, the compensation of the electron optical module 100 to coma, astigmatism, field curvature may be tuned so to compensate for and/or negate the coma, astigmatism, field curvature contributions (or a combination thereof).

For example, the contributions of the lens assembly 102 in an embodiment of the novel electron optical module 100 to the broadening of an image of the source may be represented by the relationships:

$$d_S = (0.18)C_S \cdot \omega_C^2 \cdot \bar{\omega}_C \tag{1}$$

$$d_{Coma} = \left(\frac{1}{3}\right)(C_S \cdot \omega_C^2 \cdot \bar{\gamma}_{ap} + 2C_S \cdot \omega_C \cdot \bar{\omega}_C \cdot \gamma_{ap}) \tag{2}$$

$$d_{FC} = (\sqrt{2})(C_S \cdot \gamma_{ap} \cdot \bar{\gamma}_{ap} \cdot \omega_C) \tag{3}$$

$$d_{AS} = (\sqrt{2})(C_S \cdot \gamma_{ap}^2 \cdot \bar{\omega}_C). \tag{4}$$

Here $d_S$, $d_{Coma}$, $d_{FC}$, $d_{AS}$ represent the broadening caused by spherical aberration, coma, field curvature, and astigmatism, respectively. The angle with respect to the optical axis of the micro-lens is denoted by the complex number $\omega_C = \alpha_x + i\alpha_y$ where $\alpha_x$ and $\alpha_y$ denote the angles in xz-plane and yz-plane, with the z-axis being the optical axis of the electron lens assembly. The complex number $\gamma_{ap}$ denotes in a similar way the elevation angle of the micro-lens with respect to the optical of the electron lens assembly. The bars above $\omega$ and $\gamma$ denote complex conjugation. The contribution to the spherical aberration by the electron lens assembly is denoted by $C_s$. As in most electron optical lenses, it is approximated that the off-axial aberrations of the lens assembly are dominated by the off-axial effects of the spherical aberration, and therefore, in this example, the off-axial aberrations are approximated by the off-axial effects of the spherical aberration (that is, by $C_s\,\gamma_{ap}$ and $C_s\,\gamma_{ap}^2$). By writing these relationships in this form, it is emphasized that the coma, field curvature, and astigmatism of the off-axial beam can be tuned simply by tuning the contribution to the spherical aberration $C_s$ by the electron lens assembly. It is emphasized that, because of the decelerating field in front of the micro-lens, it is possible to tune this $C_S$ not only to positive values but also to negative values.

Moreover, in certain embodiment of the present invention, the contributions of the off-axial micro-lens 106 in the electron optical module 100 to spherical aberration, coma, field curvature, and astigmatism, respectively in the off-axial electron beam 112 may be represented by the relationships:

$$d_{S(ML)} = (0.18)C_{S(ML)} \cdot \omega_C^2 \cdot \bar{\omega}_C \tag{5}$$

$$d_{CO(ML)} = \left(\frac{1}{3}F_{a(ML)}\right)(\omega_C^2 \cdot \bar{\gamma}_{ap} + 2\omega_C \cdot \bar{\omega}_C \cdot \gamma_{ap}) \tag{6}$$

$$d_{FC(ML)} = (\sqrt{2})(C_{a(ML)} + D_{a(ML)}) \cdot \gamma_{ap} \cdot \bar{\gamma}_{ap} \cdot \omega_C) \tag{7}$$

$$d_{AS(ML)} = (\sqrt{2})(C_{a(ML)} \cdot \gamma_{ap}^2 \cdot \bar{\omega}_C) \tag{8}$$

With $C_{S(ML)}$, $\gamma_{ap} \cdot F_{a(ML)}$, $\gamma_{ap}^2 \cdot D_{a(ML)}$, $\gamma_{ap}^2 \cdot C_{a(ML)}$ being the spherical-, coma-, field curvature-, and astigmatism-aberration coefficients of the micro-lens, respectively. Thus, a person having skill in the art would understand that in some embodiments of the present invention the cumulative contributions of the electron optical module 100 to the off-axial beam 112 may be represented as:

$$d_{S(Total)} = (0.18)(C_S + C_{S(ML)}) \cdot \omega_C^2 \cdot \bar{\omega}_C \quad (9)$$

$$d_{CO(Total)} = \left(\frac{1}{3}\right)(C_S + F_{a(ML)})(\omega_C^2 \cdot \bar{\gamma}_{ap} + 2\omega_C \cdot \bar{\omega}_C \cdot \gamma_{ap}) \quad (10)$$

$$d_{FC(Total)} = (\sqrt{2})(C_S + (C_{a(ML)} + D_{a(ML)})) \cdot \gamma_{ap} \cdot \bar{\gamma}_{ap} \cdot \omega_C) \quad (11)$$

$$d_{AS(Total)} = (\sqrt{2})(C_S + C_{a(ML)}) \cdot \gamma_{ap}^2 \cdot \bar{\omega}_C) \quad (12)$$

It can be understood from example relationships (1)-(12) how the dimensions, layout, and voltages of the components of the electron optical module 100 can be adjusted so that the net contribution of the electron optical module 100 to one or more of the spherical aberration, coma, astigmatism, and field curvature in the off-axial beam 112 can be a desired value, zero, near-zero, and/or can be near-zero in a particular plane when combined with the optical effects of one or more other optical elements of a charged particle microscope system. Moreover, a person having skill in the art would understand that the mathematical relationships described above are merely intended to be exemplary for assisting in the understanding of how the components of the electron optical module 100 can combine to form an electron optical module 100 for providing an off-axial electron beam without spherical aberration or coma. They represent an embodiment of the present invention, but a person having skill in the art would understand that many variations of electron optical module 100 are also included within the present disclosure based on the components and functional descriptions within the present disclosure.

The lens assembly 102 may be rotationally symmetric about optical axis 108 and may produce a virtual image. In some embodiments, the lens assembly 102 comprises an extractor electrode 116, a first set of one or more electrodes 118, and a second set of one or more electrodes 120. The lens assembly 102 is configured to apply one or more lens effects to a stream of electrons 122 emitted from an optional electron emitter 124 positioned upstream of the electron optical module 100 in a charged particle system. The lens assembly 102 may separate the electrons 122 passing through the lens assembly based on the energy of the electrons. For example, the lens assembly may provide a chromatic aberration that causes a separation of electrons 122 based on their corresponding energies, see for example EP1566826B1 by one of the present inventors. In this way, in some embodiment this separation may cause the off-axial beam 144 to include a plurality of different components of different electron energies, where different components have different trajectories when leaving the micro-lens 106 based on their associated electron energies. In addition to this separation, the position of the micro-lens 106 off the optical axis 108 causes additional chromatic effect such that there is additional dispersion of the off-axis electron beam 112. As an example, FIG. 1 shows the off-axial electron beam 112 as comprising a first component beam 126 made up of electrons having a first energy/energy range and a second component beam 128 made up of electrons having a second energy/energy range.

FIG. 1 illustrates the structure 104 obstructing the passage of electrons 122 along the optical axis 108 of the electron lens assembly 102. However, in other embodiments the structure 104 may allow the passage of electrons 122 along the optical axis 108. In various embodiments, the structure 104 may be a plate or several plates with an aperture or several apertures, a foil, thin film, a graphene or silicone barrier, or a combination of these or other type of physical structure that is able to block the transmission of electrons 122 but through the micro-lens (s) and receive an applied voltage such that it may hold a charge 110 at a point along the optical axis. In some embodiments, the charge 110 may be a negative charge that is built up by the electrons 122 striking the structure 104. The voltage potential may be applied to the structure 104 by an optional voltage source 130 electrically connected to the structure 104.

The micro-lens 106 is an optical lens component positioned off of the optical axis 108. The micro-lens 106 may be rotationally symmetric about optical axis 107. The aperture plate may be (locally) tilted such that the optical axis 107 is aligned with the off-axis beam 112. Such (local) tilt may be obtained by curving the structure 104 or by adding small electrodes or structures that effectively tilt the electric field at micro-lens 106. The structure 104 may be an aperture plate and the micro-lens 106 may be a micro-aperture defined by the aperture plate whose lensing effect is created by the penetration of the electrostatic field between the lens assembly 102 and the micro-lens 106. Alternatively, or in addition, the structure 104 and the micro-lens 106 may be component portions of a MEMS system that both blocks the passage of electrons 122 along the optical axis 108, while also creating an electron lens 106. In other embodiments, the micro-lens 108 may correspond to and/or comprise rotationally symmetric apertures with multipoles around the apertures, an electrostatic micro-lens, a magnetic plate, or a combination thereof. For example, a micro-lens 108 may comprise a combination of an electrostatic micro-lens with a magnetic micro-lens, such that it applies both electrostatic and magnetic effects at the same time.

In some embodiments, the electron optical module 100 may include one or more additional apertures and/or lenses configured to allow a portion of electrons 122 to pass beyond the structure 104. For example, FIG. 1 shows the electron optical module 100 as including an optional additional micro-lens/aperture 132 approximate to, but off the optical axis 108. In some embodiments, such an optional lens/aperture 132 may allow a portion of the electrons 122 to pass beyond the structure 104 to prevent irradiation damage and/or excessive charge buildup caused by the electrons 122 being incident on the structure 104. Alternatively, or in addition, one or more optional additional micro-lens/apertures 132 may allow portions of electrons 122 to pass through the structure 104 so as to create corresponding additional off-axial electron beams that have no spherical aberration, coma, field curvature, and/or astigmatism. In some embodiments, the electron optical module 100 may optionally include additional micro-lenses, where individual micro-lenses of have different sizes, such that a user can alter the characteristics of the off-axial beam 112 by select the particular micro-lens that it passes through.

In some embodiments, the electron optical module 100 is a component portion of a charged particle system. Additionally, the electron optical module 100 may be a component portion of an optical component within (or build to be included within) a charged particle system, such as a monochromator, a coma corrector, a spherical aberration corrector, etc.

Figure 2:
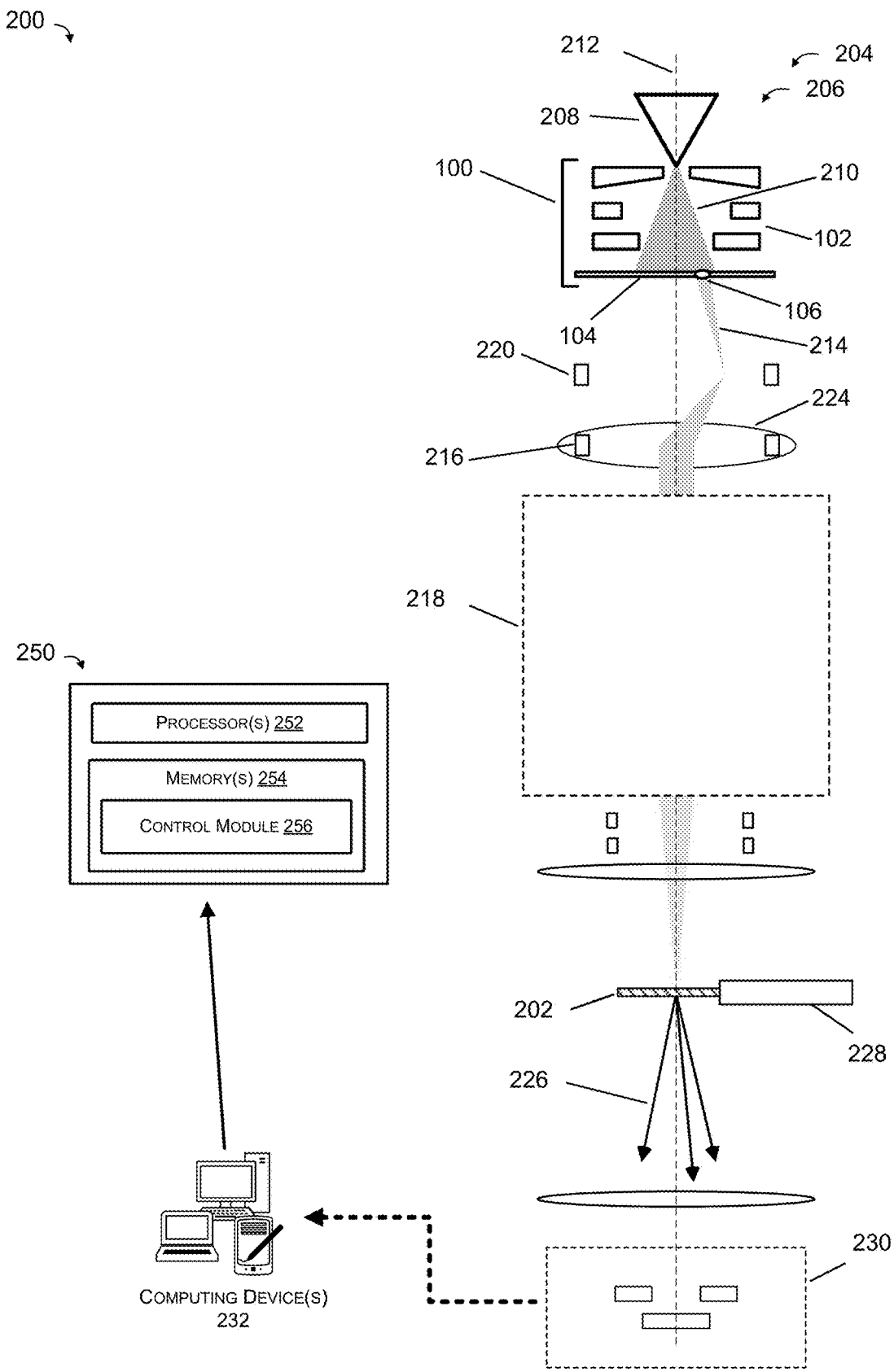
FIG. 2 illustration of an example environment for providing an off-axial electron beam with a tunable coma for investigation of a sample.

FIG. 2 is an illustration of example environment 200 for providing an off-axial electron beam with a tunable coma for investigation of a sample 202. Specifically, FIG. 2 shows example environment 200 as including example charged particle system(s) 204 for investigation and/or analysis of a sample 202. The example charged particle system(s) 204 may be or include one or more different types of optical, and/or charged particle microscopes, such as, but not limited to, a scanning electron microscope (SEM), a scanning transmission electron microscope (STEM), a transmission electron microscope (TEM), a charged particle microscope (CPM), a cryo-compatible microscope, focused ion beam microscope (FIBs), dual beam microscopy system, or combinations thereof. FIG. 2 shows the example charged particle microscope system(s) 204 as being a transmission electron microscope (TEM) 206.

The example charged particle microscope system(s) 204 includes a charged particle source 208 (e.g., a thermal electron source, Schottky-emission source, field emission source, etc.) that emits an electron beam 210 along an emission axis 212 and towards a electron optical module 100 for providing an off-axial electron beam 214 without spherical aberration or coma. The electron optical module 100 comprises an electron lens assembly 102, a structure 104, and an off-axial micro-lens 106. The structure 104 is shown as being positioned downstream of the lens assembly 102 such that the structure blocks the path of electron beam 210 traveling along the optical axis of the lens assembly. A voltage potential is applied to the structure 104 such that it may hold a charge 110 at a point along the optical axis of the lens assembly 102 when the electron optical module 100 is in use. The micro-lens 106 is positioned off the optical axis of the lens assembly 102 and is configured to apply a lensing effect to the off-axial electron beam 214.

According to the present invention, the lens assembly 102 and the micro-lens 106 are configured such that their individual contributions to coma combine such that the off-axial beam 214 has a desired value of coma in one or more planes downstream of the electron optical module 100. In embodiments of the present invention, the combined contribution of the coma of the electron lens assembly 102 and the coma of the micro-lens 106 cause the off-axial electron beam 214 to have no coma downstream of the electron optical module 100. Alternatively, the combined contributions of the lens assembly 102 and the micro-lens 106 may further combine with the aberrations of other optical elements in the example charged particle microscope system(s) 204 (e.g., components of the focusing column 218, an objective lens, transfer lens(es), an accelerator lens, etc., or a combination thereof) such that the net coma of the off-axial electron beam 214 is a desired value, zero (or near zero) in a plane downstream of the electron optical module 100 (e.g., the sample plane).

In addition, in some embodiments the negative spherical aberration of the lens assembly 102 compensates and/or negates other off-axial aberrations in the micro-lens 106 (or the cumulative off-axial aberrations from other elements in the system), including spherical aberration, coma, astigmatism, field curvature, etc. For example, the aberration of the lens assembly 102 may contribute to a negative spherical aberration effect that compensates a positive spherical aberration effect of the micro-lens 106 such that the off-axial electron beam 214 has no spherical aberration in a downstream plane. Similarly, by adjusting the dimensions, layout, and voltages of the components of the electron optical module 100 the contribution to one or more of spherical aberration, coma, astigmatism, field curvature, of the lens assembly 102 may compensate for and/or negate the spherical aberration, coma, astigmatism, field curvature contributions (or a combination thereof) of the micro-lens 106 to the off-axial electron beam 214.

The emission axis 212 is a central axis that runs along the length of the example charged particle microscope system(s) 204 from the charged particle source 208 and through the sample 202. In some embodiments, an accelerator lens may be positioned between the charged particle source 208 and the electron optical module 100. Such an accelerator lens accelerates/decelerates, focuses, and/or directs the electron beam 210 towards the electron optical module 100 (when positioned above it) or towards a focusing column 218 (when positioned below the electron optical module 100).

FIG. 2 shows the charged particle system(s) 204 as including at least a first deflector 220 configured to deflect the off-axial electron beam 214 towards the emission axis 212. The illustrated charged particle system(s) 204 further shows at least a second deflector 222 that is configured to apply an additional deflection to the off-axial electron beam 214 such that it becomes an axial beam (i.e., travels along the emissions axis 212 and/or optical axis of the focusing column 218). In some embodiments, the second deflector 222 may optionally be positioned with or near a lens 224, a slit, or another optical component.

The focusing column 218 focuses the off-axial electron beam 214 so that it is incident on at least a portion of the sample 202. In some embodiments, the focusing column 218 may include one or more of an aperture, scan coils, and upper condenser lens. The focusing column focuses electrons from electron source into a small spot on the sample. Different locations of the sample 202 may be scanned by adjusting the electron beam direction via the scan coils. Additionally, the focusing column 218 may correct and/or tune aberrations (e.g., geometric aberrations, chromatic aberrations) of the off-axial electron beam 214.

During TEM imaging, the off-axial electron beam 214 is directed such that it irradiates and/or passed through a region of interest on the sample 202. A portion of the electrons 226 passing through sample 202 and/or emissions 226 caused by the off-axial electron beam 214 impinge on a microscope detector system 230. In this way, electrons and/or emissions generated during irradiation of the sample 202 are captured by the detector system 230, which then generates detector data that can be used to create a reconstruction of the region of interest of the sample 202. In FIG. 2, the microscope detector system 230 is illustrated as including a disk-shaped bright field detector and dark field detector(s). In some embodiments, the microscope detector system 230 may include one or more other detectors. Alternatively, or in addition, the microscope detector system 230 may include a scanning electron microscope detector system, a focused ion beam detector system, a scanning electron microscope secondary electron detector system, a focused ion beam secondary electron detector system, and an optical microscope detector system.

FIG. 2 further illustrates the example charged particle microscope system(s) 204 as further including a sample holder 228 and computing device(s) 232. The sample holder 228 is configured to hold the sample 202, and is able to translate, rotate, and/or tilt the sample 202 in relation to the example charged particle microscope system(s) 204. While the sample 202 is depicted as a lamella attached to a sample holder capable of manipulating the lamella within the vacuum chamber, in other embodiments the sample holder may be a structure that includes one or more sample supports (e.g., mesh, foil, grids, etc.) configured to contain the sample, and which is configured to inserted into the charged particle microscope system(s) 204 and attached/connected to sample stage that is able to translate, rotate, and/or tilt the sample holder 202 in relation to the example charged particle microscope system(s) 204. For example, the sample holder 202 may comprise a sample support such as a conductive foil that defines apertures where a sample 202 can be held for TEM investigation. In cryo-TEM, the sample 202 may correspond to biological or other matter (e.g., proteins) suspended in amorphous ice located within the apertures defined by a conductive sample holder foil.

FIG. 2 further includes a schematic diagram illustrating an example computing architecture 250 of the computing devices 232. Example computing architecture 250 illustrates additional details of hardware and software components that can be used to implement the techniques described in the present disclosure. Persons having skill in the art would understand that the computing architecture 250 may be implemented in a single computing device 232 or may be implemented across multiple computing devices. For example, individual modules and/or data constructs depicted in computing architecture 250 may be executed by and/or stored on different computing devices 232. In this way, different process steps of the inventive method according to the present disclosure may be executed and/or performed by separate computing devices 232.

In the example computing architecture 250, the computing device includes one or more processors 252 and memory 254 communicatively coupled to the one or more processors 252. The example computing architecture 250 can include a control module 256 stored in the memory 254. As used herein, the term "module" is intended to represent example divisions of executable instructions for purposes of discussion and is not intended to represent any type of requirement or required method, manner or organization. Accordingly, while various "modules" are described, their functionality and/or similar functionality could be arranged differently (e.g., combined into a fewer number of modules, broken into a larger number of modules, etc.). Further, while certain functions and modules are described herein as being implemented by software and/or firmware executable on a processor, in other instances, any or all of modules can be implemented in whole or in part by hardware (e.g., a specialized processing unit, etc.) to execute the described functions. As discussed above in various implementations, the modules described herein in association with the example computing architecture 250 can be executed across multiple computing devices 232.

The control module 256 can be executable by the processors 252 to cause a computing device 232 and/or example charged particle microscope system(s) 204 to take one or more actions. For example, the control module 256 may cause the example charged particle microscope system(s) 204 to cause the sample holder 228 to apply a translation, tilt, rotation, or a combination thereof. Additionally, the control module 256 may cause the charged particle emitter 208 to emit the electron beam 210.

In some embodiments, the control module 256 may be further configured to cause a computing device 232 to adjust one or more optical characteristics of optical elements (e.g., position, orientation, mode of operation, applied voltages, etc.) in the example charged particle microscope system(s) 204 or components thereof. For example, the control module 256 may cause the voltages applied to the lens assembly 102 and/or component elements thereof so that lens assembly' contribution to one or more of the spherical aberration, coma, astigmatism, and field curvature to the electron beam 210 is such that the spherical aberration, coma, astigmatism, and/or field curvature of the off-axial beam 214 is zero, near-zero, and/or equal to a desired non-zero value in a particular plane. For example, the voltages applied to component electrodes of the lens assembly 102 may be adjusted so that the off-axial beam 214 has a coma coefficient that, when combined with the coma contributions of optical elements downstream of the electron optical module 100, results in the images generated from emissions 226 not having a coma effect at a particular plane.

Alternatively or in addition, the control module 256 may adjust the optical characteristics of or other components of the example charged particle microscope system(s) 204 (e.g., components of the focusing column 218, an objective lens, transfer lens(es), an accelerator lens, etc., or a combination thereof) so that the combined spherical aberration, coma, astigmatism, and/or field curvature in the off-axial beam 214 at the sample 202 is zero, near zero, or is equal to a desired non-zero value. The selections of such optical characteristics may be based on predetermined mathematical relationships for the system, based on sensor input from the charged particle microscope system(s) 204, based on image data, or a combination thereof. For example, based on the control module 256 detecting a coma effect in an image generated from emission 226, the control module 256 determine an adjustment to the optical characteristics of the other components of the electron optical module 100, other optical components of the example charged particle microscope system(s) 204, and/or components thereof, that would correct the detected coma effect, and then adjust the optical characteristics such that subsequent images generated from emission 226 do not have the detected coma effect.

As discussed above, the computing devices 226 include one or more processors 252 configured to execute instructions, applications, or programs stored in a memory(s) 254 accessible to the one or more processors. In some examples, the one or more processors 252 may include hardware processors that include, without limitation, a hardware central processing unit (CPU), a graphics processing unit (GPU), and so on. While in many instances the techniques are described herein as being performed by the one or more processors 252, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories 254 accessible to the one or more processors 252 are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory 254 and other storage devices for purposes of memory management and data integrity. Alternatively, in other implementations, some or all of the software components may execute in memory on another device and communicate with the computing devices 226. Some or all of the system components or data structures may also be stored (e.g., as instructions or structured data) on anon-transitory, computer accessible medium or a portable article to be read by an appropriate drive, various examples of which are described above. In some implementations, instructions stored on a computer-accessible medium separate from the computing devices 226 may be transmitted to the computing devices 226 via transmission media or signals such as electrical, electromagnetic, or digital signals, conveyed via a communication medium such as a wireless link. Various implementations may further include receiving, sending or storing instructions and/or data implemented in accordance with the foregoing description upon a computer-accessible medium.

Figure 3:
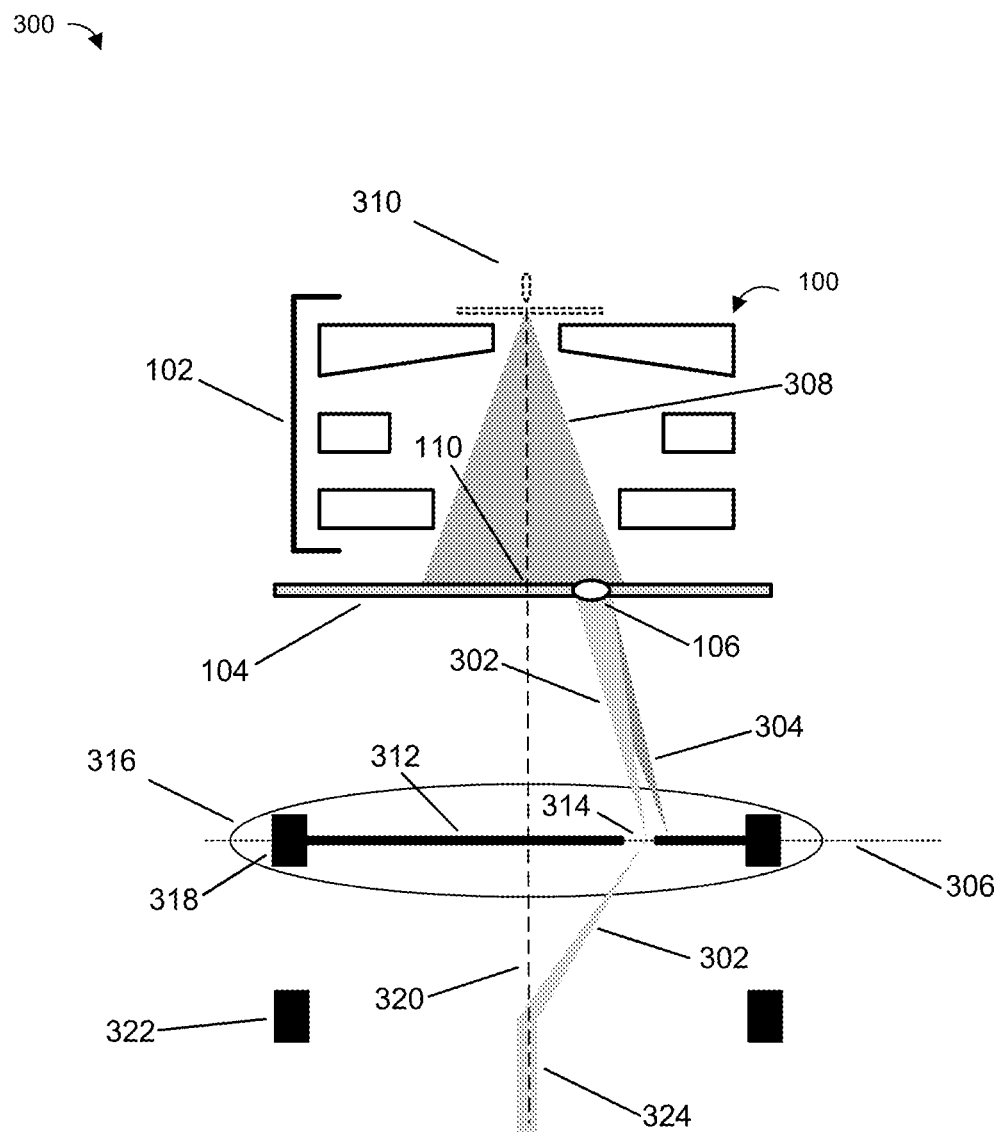
FIG. 3 illustrates an example monochromator for providing an off-axial electron beams of a desired energy range without coma.

FIG. 3 is an illustration of an example monochromator 300 for providing an off-axial electron beams of a desired energy range with a tunable coma. The monochromator 300 is configured to generate an off-axial electron beam 302 of a desired energy and/or energy range. Additionally, due to the monochromator 300 comprising an electron optical module 100, the off-axial electron beam 302 may also have a zero, near zero, or desired non-zero coefficient of one or more of spherical aberration, coma, astigmatism, field curvature contributions (or a combination thereof). By tuning one or more of these aberrations to zero or to near zero, the energy resolution of the monochromator can be improved or optimized.

The optical module 100 is illustrated as comprising an electron lens assembly 102, a structure 104, and an off-axial micro-lens 106. The structure 104 is shown as being positioned downstream of the lens assembly 102 when used in a charged particle system. In some embodiments, the structure may be positioned to block the path of electrons traveling along the optical axis of the lens assembly. When the electron optical module 100 is in use, a voltage potential is applied to the structure 104, such that it may holds a charge 110 at a location along the optical axis 108. The micro-lens 106 is positioned off the optical axis 108 of the lens assembly 102 and is configured to apply a lensing effect to off-axial electron beams 302 and 304.

According to the present invention, the combined contribution of the coma of the electron lens assembly 102 and the coma contribution of the micro-lens 106 cause the off-axial electron beams 302 and 304 to have no coma in a plane 306 downstream of the electron lens when used in a charged particle system. Alternatively, the combined contributions to the coma of the lens assembly 102 and the micro-lens 106 may further combine with the coma of other optical elements in a charged particle system so that the net coma of the off-axial electron beams 302 and 304 is zero (or near zero) in a plane downstream of the electron optical module 100 (e.g., the sample plane).

In addition, in some embodiments the contribution to aberrations by the lens assembly 102 may compensates and/or negates other off-axial aberrations in the micro-lens 106 (or the cumulative off-axial aberrations from other elements in the system), including spherical aberration, coma, astigmatism, field curvature, etc. For example, the negative spherical aberration of the lens assembly 102 may contribute to an astigmatism effect that compensates an astigmatism effect of the micro-lens 106 such that the off-axial electron beams 302 and 304 have no astigmatism in a downstream plane. Similarly, by adjusting the dimensions, layout, and voltages of the components of the electron optical module 100 the aberration contributions of the lens assembly 102 may compensate for and/or negate the spherical aberration, coma, astigmatism, field curvature contributions (or a combination thereof) of the micro-lens 106 to the off-axial electron beams 302 and 304.

Such compensation or negation can be used to improve or optimize the energy resolution of, for example, a monocromating module downstream: The lens assembly 102 is configured to apply one or more lens effects to a stream of electrons 308 emitted from an optional electron emitter 310 positioned upstream of the electron optical module 100 in a charged particle system. The lens assembly 102 may cause a chromatic aberration that creates a separation of electrons 308 based on their corresponding energies. In this way, in some embodiments this separation may cause the off-axial beams 302 and 304 to include a plurality of different components of different electron energies, where different components have different trajectories when leaving the micro-lens 106 based on their associated electron energies. For example, FIG. 3 illustrates two off-axial beams leaving the micro-lens 106, a first off-axial beam 302 having a first energy/energy range and a second off-axial beam 304 having a second, different energy/energy range. A person having skill in the art would understand that the chromatic aberration applied by the lens assembly 102 would create a plurality of off-axial beams corresponding to the spectrum of energies/wavelengths present in the stream of electrons 308. As illustrated in FIG. 3, each of these off-axial beams would leave the micro-lens 106 with a slightly different trajectory based on their corresponding energy.

FIG. 3 illustrates the monochromator 300 as including a beam blocker 312 having an aperture 314. The beam blocker 312 includes a body that obstructs the passage of one or more of the off-axial beams leaving the micro-lens 106 (e.g., off-axial beam 304), while allowing the one or more off-axial beams to pass through the aperture (e.g., 302). In this way, the beam blocker 312 is configured to allow only a subset of off-axial beams having particular energies to pass. For example, the aperture 314 may be a slit configured to allow only off-axial beams having a desired energy/energy range to pass. In some embodiments, the beam blocker 312 may be translated so that a different energy range of off-axial beams is allowed to pass through the aperture 314. Alternatively or in addition, a deflector or electron lens may be used to change the off-axial beams that pass through the aperture 314 (i.e., deflecting the beams a beam so that it passes through the aperture 314, changing the focus of the off-axial beams so that more or fewer off-axial beams pass through the aperture, etc.).

In some embodiments, an optional electron lens 316 or optional electrode 316 may be included in the monochromator 300. For example, the optional electron lens 316 may adjust the focus of the off-axial electron beams 302 and/or 304 so that a desired beam path is achieved. In another example, the monochromator 300 may include optional deflectors 318 that apply a deflection to the off-axial beam 302 so that it is deflected towards the optical axis 320 of a charged particle system in which it is used. The monochromator 300 may also optionally include additional deflectors 322 that is configured to apply an additional deflection to the off-axial beam 302 such that it becomes an axial electron beam 324. In this way, the monochromator 300 can generate an axial electron beam electron beams of a desired energy range having a zero, near zero, or desired non-zero coefficient of one or more of spherical aberration, coma, astigmatism, field curvature contributions (or a combination thereof).

Figure 4:
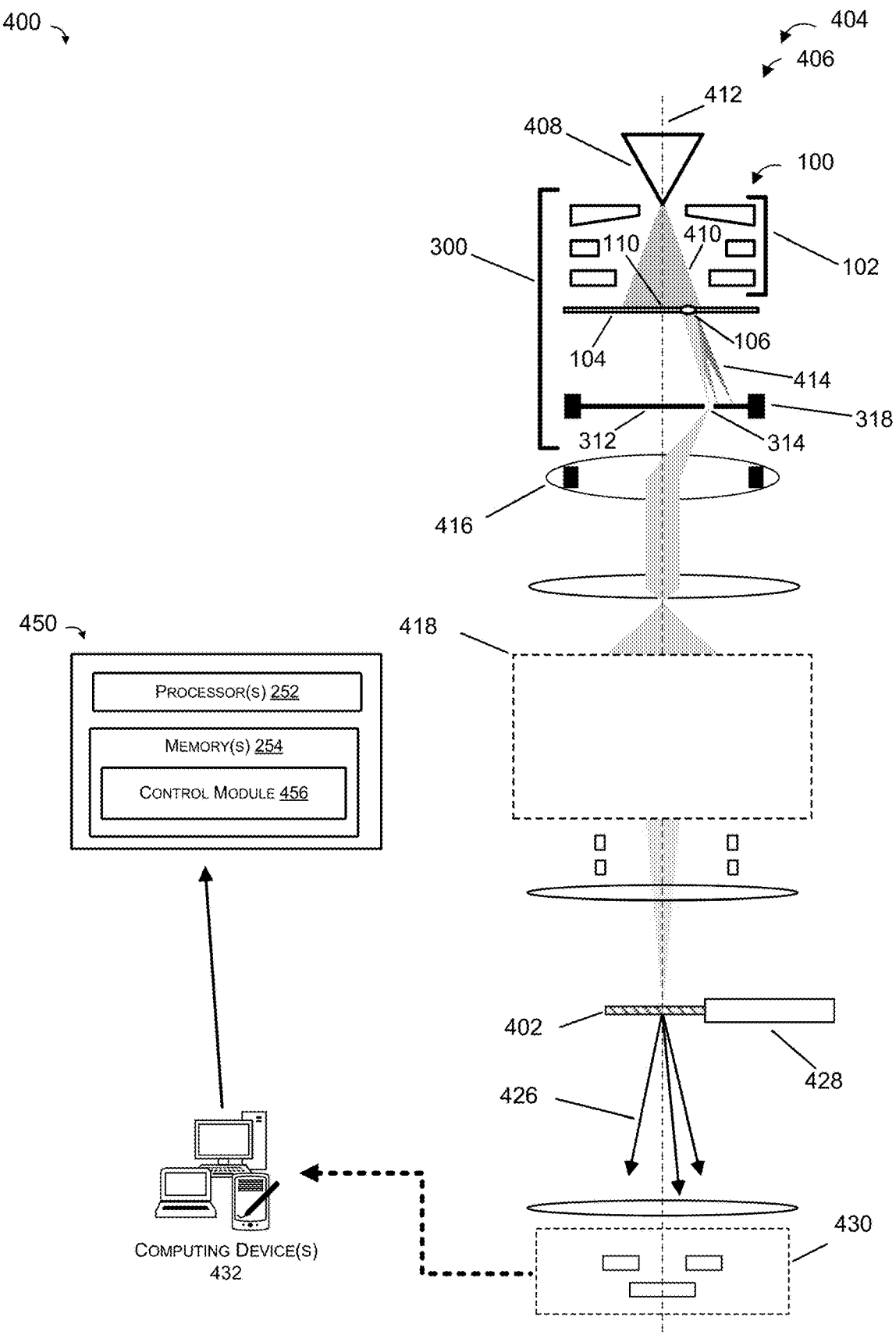
FIG. 4 illustration of an example environment for investigation of a sample that includes a monochromator for providing an off-axial electron beams of a desired energy range without coma.

FIG. 4 is an illustration of example environment 400 for investigation of a sample 402 that includes a monochromator 300 for providing an off-axial electron beams of a desired energy range with a tunable coma. Specifically, FIG. 4 shows example environment 400 as including example charged particle system(s) 404 for investigation and/or analysis of a sample 402. FIG. 4 shows the example charged particle microscope system(s) 204 as being a transmission electron microscope (TEM) 406. However, a person having skill in the art would understand from the present disclosure how monochromator 300 may be incorporated into other types charged particle systems 204 for investigation of a sample 402.

The example charged particle microscope system(s) 404 includes a charged particle source 408 that emits an electron beam 410 along an emission axis 412 and towards the monochromator 300 for providing an off-axial electron beam(s) 414 of a desired energy range without spherical aberration or coma.

The monochromator 300 according to the present disclosure comprises a electron optical module 100, which causes the off-axial electron beam(s) 414 generated by the monochromator 300 to have a zero, near zero, or desired non-zero coefficient of one or more of spherical aberration, coma, astigmatism, field curvature contributions (or a combination thereof). The optical module 100 comprises an electron lens assembly 102, an off-axial micro-lens 106, and a structure 104 positioned downstream of the lens assembly 102 when used in a charged particle system such that the structure blocks the path of electrons traveling along the optical axis of the lens assembly. When the electron optical module 100 is in use, the structure 104 may hold a charge 110 is on the optical axis of the lens assembly 102. The micro-lens 106 is positioned off the optical axis 108 of the lens assembly 102 and is configured to apply a lensing effect to off-axial electron beams 414.

In embodiments of the present invention, the combined contribution of the coma of the electron lens assembly 102 and the contribution to coma of the micro-lens 106 cause the off-axial electron beams 414 to have no coma in a plane downstream of the electron lens when used in a charged particle system. Alternatively, the combined contributions to the coma of the lens assembly 102 and the micro-lens 106 may further combine with the spherical aberrations of other optical elements in the charged particle system 303 (e.g., components of the focusing column 218, an objective lens, transfer lens(es), an accelerator lens, etc., or a combination thereof) so that the net coma of the off-axial electron beams 414 is zero (or near zero) in a plane downstream of the monochromator 300 (e.g., the sample plane, slit plane, etc.).

In addition, in some embodiments the contribution of aberrations of the lens assembly 102 compensates and/or negates other off-axial aberrations in the micro-lens 106 (or the cumulative off-axial aberrations from other elements in the system), including coma, astigmatism, field curvature, etc. For example, the contributions to field curvature of the lens assembly 102 may compensate for a field curvature effect applied by the micro-lens 106 such that the off-axial electron beams 414 have no field curvature in a downstream plane. Similarly, by adjusting the dimensions, layout, and voltages of the components of the electron optical module 100, the aberrations of the lens assembly 102 may compensate for and/or negate the coma, astigmatism, field curvature contributions (or a combination thereof) of the micro-lens 106 to the off-axial electron beams 414.

The lens assembly 102 is further configured to apply one or more lens effects to an electron beam 410. For example, the lens assembly 102 may cause a chromatic aberration that creates a separation of electrons 410 based on their corresponding energies. In this way, in some embodiments this separation may cause the off-axial beams 414 to include a plurality of different components of different electron energies, where different components have different trajectories when leaving the micro-lens 106 based on their associated electron energies. For example, FIG. 4 illustrates three off-axial beams 414 leaving the micro-lens 106 having different energy/energy ranges. A person having skill in the art would understand that the chromatic aberration applied by the lens assembly 102 would create a plurality of off-axial beams corresponding to the spectrum of energies/wavelengths present in the stream of electron beam 410. As illustrated in FIG. 4, each of these off-axial beams would leave the micro-lens 106 with a slightly different trajectory based on their corresponding energy. However, due to the aberration contributions of the lens assembly 102, each of these off-axial beams can have a zero, near zero, or desired non-zero coefficient of one or more of spherical aberration, coma, astigmatism, field curvature contributions (or a combination thereof).

FIG. 4 illustrates the monochromator 300 as further including a beam blocker 312 having an aperture 314. The beam blocker 312 includes a body that obstructs the passage of one or more of the off-axial beams leaving the micro-lens 106, while allowing the one or more off-axial beams to pass through the aperture. In this way, the beam blocker 312 is configured to allow only a subset of off-axial beams having particular energies to pass. In some embodiments, the beam blocker 312 may be translated so that a different energy range of off-axial beams is allowed to pass through the aperture 314. Alternatively, or in addition, a deflector or electron lens may be used to change the off-axial beams that pass through the aperture 314.

In some embodiments, an optional electron lens 316 or optional electrode 316 may be included in the monochromator 300. For example, the optional electron lens 316 may adjust the focus of the off-axial electron beams 302 and/or 304 so that a desired beam path is achieved. In another example, the monochromator 300 may include optional deflectors 318 that apply a deflection to the off-axial beam 302 so that it is deflected towards the mission axis 412.

In some embodiments, charged particle system(s) 404 or the monochromator 300 itself may also optionally include additional deflectors 416 that are configured to apply an additional deflection to an off-axial beam such that it becomes an axial electron beam. In this way, the additional deflectors 416 may cause an off-axial beam to become an axial electron beam. FIG. 4 shows the charged particle system(s) 404 as including at least additional deflectors 416 configured to apply an additional deflection to the off-axial electron beam 414 such that it becomes an axial beam (i.e., travels along the emissions axis 412 and/or optical axis of the focusing column 418). In some embodiments, the additional deflectors 416 may optionally be positioned with or near a lens, a slit, or another optical component.

The emission axis 412 is a central axis that runs along the length of the example charged particle microscope system(s) 404 from the charged particle source 408 and through the sample 402. In some embodiments, an accelerator lens may be positioned between the charged particle source 408 and the monochromator 300. Such an accelerator lens accelerates/decelerates, focuses, and/or directs the electron beam 410 towards the monochromator 300 (when positioned above it) or towards a focusing column 418 (when positioned below the electron optical module 100).

The focusing column 418 focuses the off-axial electron beam 414 so that it is incident on at least a portion of the sample 402. In some embodiments, the focusing column 418 may include one or more of an apertures, scan coils, and upper condenser lens. The focusing column focuses electrons from electron source into a small spot on the sample. Different locations of the sample 402 may be scanned by adjusting the electron beam direction via the scan coils. Additionally, the focusing column 418 may correct and/or tune aberrations (e.g., geometric aberrations, chromatic aberrations) of the off-axial electron beam 414.

During TEM imaging, the off-axial electron beam 414 is directed such that it irradiates and/or passed through a region of interest on the sample 402. A portion of the electrons 426 passing through sample 402 and/or emissions 426 caused by the off-axial electron beam 414 impinge on a microscope detector system 430. In this way, electrons and/or emissions generated during irradiation of the sample 402 are captured by the detector system 430, which then generates detector data that can be used to create a reconstruction of the region of interest of the sample 402. FIG. 4 further illustrates the example charged particle microscope system(s) 204 as further including a sample holder 428 and computing device(s) 432. The sample holder 428 is configured to hold the sample 402, and is able to translate, rotate, and/or tilt the sample 402 in relation to the example charged particle microscope system(s) 404.

FIG. 4 further includes a schematic diagram illustrating an example computing architecture 450 of the computing devices 432. Example computing architecture 450 illustrates additional details of hardware and software components that can be used to implement the techniques described in the present disclosure. Persons having skill in the art would understand that the computing architecture 450 may be implemented in a single computing device 432 or may be implemented across multiple computing devices. For example, individual modules and/or data constructs depicted in computing architecture 450 may be executed by and/or stored on different computing devices 432. In this way, different process steps of the inventive method according to the present disclosure may be executed and/or performed by separate computing devices 432.

In the example computing architecture 450, the computing device includes one or more processors 252 and memory 254 communicatively coupled to the one or more processors 252. The example computing architecture 450 can include a control module 456 stored in the memory 254. As discussed above in various implementations, the modules described herein in association with the example computing architecture 450 can be executed across multiple computing devices 432.

The control module 256 can be executable by the processors 252 to cause a computing device 432 and/or example charged particle microscope system(s) 404 to take one or more actions. For example, the control module 456 may cause the example charged particle microscope system(s) 404 to cause the sample holder 428 to apply a translation, tilt, rotation, or a combination thereof. Additionally, the control module 256 may cause the charged particle emitter 408 to emit the electron beam 410.

In some embodiments, the control module 456 may be further configured to cause a computing device 432 to adjust one or more optical characteristics of optical elements (e.g., position, orientation, mode of operation, applied voltages, etc.) in the example charged particle microscope system(s) 404 or components thereof. For example, the control module 456 may cause the voltages applied to the lens assembly 402 and/or component elements thereof so that lens assembly' contribution to one or more of the spherical aberration, coma, astigmatism, and field curvature to the electron beam 410 is such that the spherical aberration, coma, astigmatism, and/or field curvature of the off-axial beam 414 is zero, near-zero, and/or equal to a desired non-zero value. For example, the voltages applied to component electrodes of the lens assembly 102 may be adjusted so that the off-axial beam 414 has a coma coefficient that, when combined with the coma contributions of optical elements downstream of the monochromator 300, results in the images generated from emissions 426 not having a coma effect.

Alternatively or in addition, the control module 456 may adjust the optical characteristics of or other components of the example charged particle microscope system(s) 404 (e.g., components of the focusing column 418, an objective lens, transfer lens(es), an accelerator lens, etc., or a combination thereof) so that the combined spherical aberration, coma, astigmatism, and/or field curvature in the off-axial beam 414 at the sample 402 is zero, near zero, or is equal to a desired non-zero value. The selections of such optical characteristics may be based on predetermined mathematical relationships for the system, based on sensor input from the charged particle microscope system(s) 404, based on image data, or a combination thereof. For example, based on the control module 456 detecting a coma effect in an image generated from emission 426, the control module 456 determine an adjustment to the optical characteristics of the other components of the monochromator 300, other optical components of the example charged particle microscope system(s) 404, and/or components thereof, that would correct the detected coma effect, and then adjust the optical characteristics such that subsequent images generated from emission 426 do not have the detected coma effect.

The control module 256 may further be executable to adjust the subset of off-axial beams 414 that pass through the aperture 314. For example, the control module 256 may cause a deflection to be applied to the off-axial beams 414 so that the trajectories of the beams are changed and/or the beam blocker 312 may be translated so that different subsets of the off-axial beam 414 are blocked. In this way, the control module 256 can change the energy/energy ranges of electron beams that are allowed to propagate out of the monochromator 300. In some embodiments such adjustments may be applied so that the sample 402 is irradiated with an electron beam having a desired energy/energy range. Alternatively, or in addition, such adjustments may be applied so that the sample 402 is irradiated with an electron beam having a desired intensity.

Figure 5:
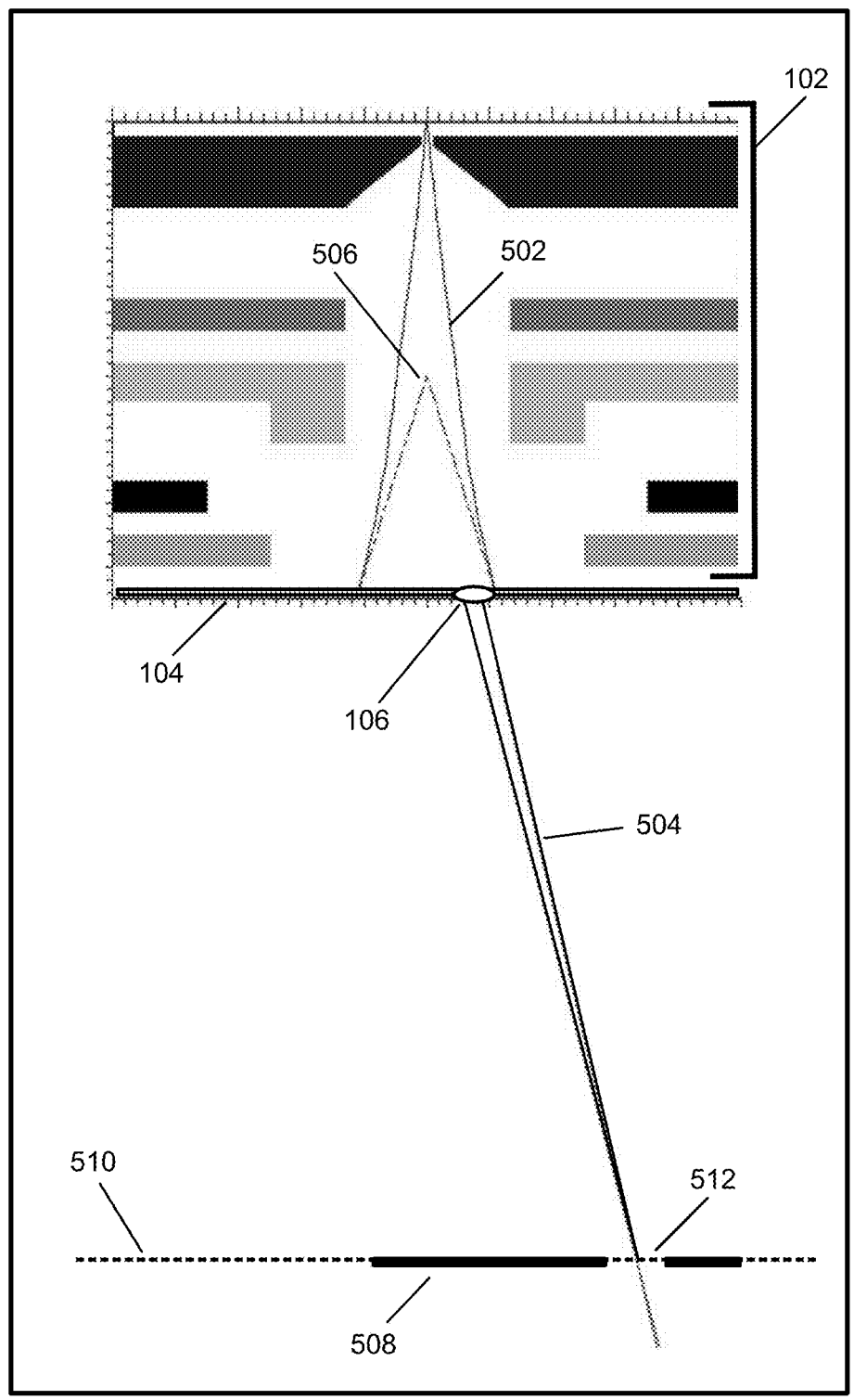
FIG. 5 is an illustration of a simulated electron optical module for providing an off-axial electron beam with a tunable coma.

FIG. 5 is a simulated electron optical module 500 for providing an off-axial electron beam with a tunable coma. That is, FIG. 5 shows a simulation of an embodiment of the electron optical module 100 that has been specifically configured to provide an off-axial electron beam with a desired coma value in a downstream plane using techniques described herein. The simulations discussed herein were performed using 3D and 3D field calculations and ray tracing software.

The simulated lens 500 is shown as including a lens assembly 102, a structure 104, and a micro-lens 106. FIG. 5 further shows a stream of electrons 502 being emitted downward from a point source above the lens assembly 102, and an off-axial electron beam 504 that is exiting the micro-lens 106. In the simulation 500 the structure 104 is an aperture plate, and the micro-lens 106 is a 100 μm aperture lens. FIG. 5 also shows a virtual source 506 of the stream of electrons 502 that is created by the lens assembly 102.

FIG. 5 also includes a beam blocker 508 positioned in a slit plane 510 downstream of the lens configured to block a subset of off-axial electron beams 504 having particular energies/energy ranges. The beam blocker 508 is shown as defining a slit 512 that allows a subset of off-axial electron beams 504 having a particular energy/energy range pass through the beam blocker 508. The simulated high electron lens 500 was configured with tuned optical parameters of its components (i.e., adjusted size, design, voltages applied, etc.) such that one or more of the spherical aberration, coma, field curvature; and astigmatism of the lens assembly is the negative value of the spherical aberration, coma, field curvature; and astigmatism of the micro-lens. This specific configuration of the optical parameters of electron optical module 100 results in the lens assembly 102 having a spherical aberration coefficient of −70 mm and a coma coefficient of −85 mm.

Figure 6:
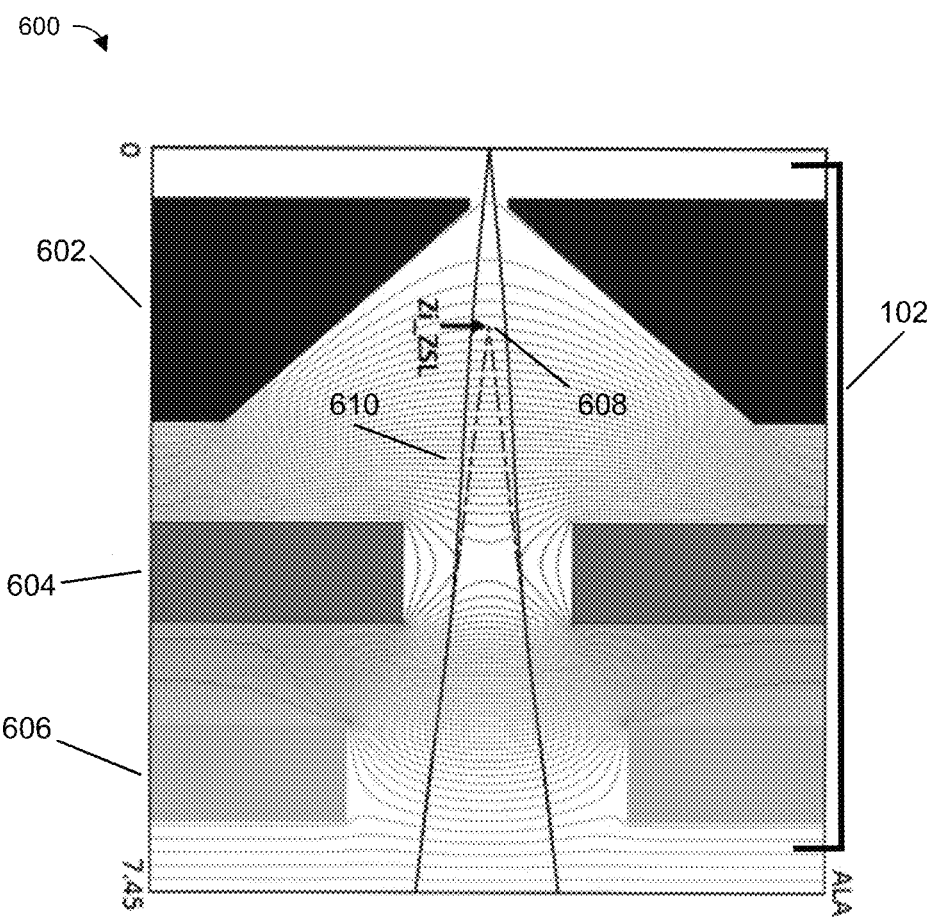
FIG. 6 is an illustration of a simulation of the electromagnetic effects of a lens assembly in an electron optical module, according to the present disclosure.

FIG. 6 is an image 600 of a simulation of the electromagnetic effects of a lens assembly in an electron optical module 100, according to the present disclosure. FIG. 6 shows the lens assembly 102 as including an extractor 602, a first electrode 604, and a second electrode 606. FIG. 6 also shows the virtual source 608 of the emitted electrons 610 created by the lens assembly 120.

Figure 7:
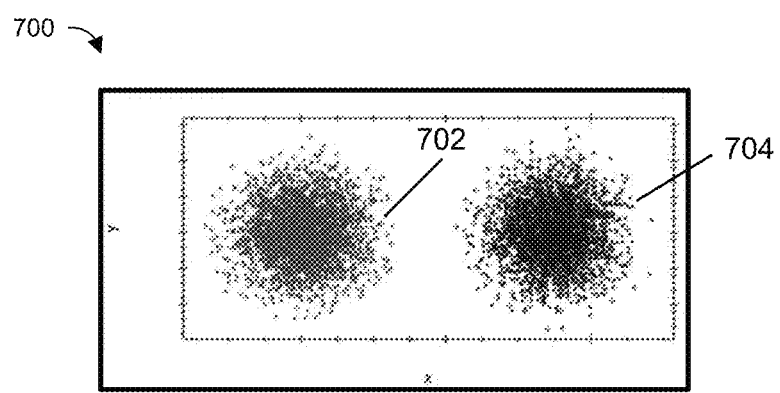
FIG. 7 is an illustration of a simulation results of two sets of electrons having different energies passing through the simulated electron optical module of FIG. 5.

FIG. 7 is a depiction of simulation results 700 of two sets of electron beams having different energies passing through the simulated electron optical module 100 of FIG. 5. Specifically, FIG. 7 corresponds to a 3D simulation result of electrons of two different energies traversing the simulated electron optical module 100 of FIG. 5. Clusters 702 and 704 show the positions of the simulated electrons of two different energies in the slit plane. Cluster 702 shows the ray tracing results of electrons having a charge of 4500.1 eV, while the cluster 704 shows the ray tracing results of electrons having a charge of 4500 eV. As can be seen from the simulation results 700, each of the clusters is cylindrical and clearly separated. This shows that the simulated electron lens 500 was able to produce two off-axial electron beams that did not have coma nor any other off-axial aberrations. In other words, the lens assembly of the simulated electron lens 500 had negative spherical aberration and coma coefficients that, when combined with the contributions of the other optical elements of the simulated electron lens 500, resulted in each of the simulated off-axial electron beams did not have spherical aberration or coma. However, a person having skill in the art would understand that the optical parameters used to simulate the electron lens 500 are not limiting. Rather, they merely represent an exemplary embodiment of electron lenses 100 according to the present invention. A person having skill in the art would understand how to use the relationships and functional descriptions included in this disclosure to adjust the optical parameters of the components of a electron optical module 100 to create many different embodiments within the present disclosure that provide one or more off-axial electron beam without spherical aberration or coma.

Examples of inventive subject matter according to the present disclosure are described in the following enumerated paragraphs.

A1. An electron optical module for providing an off-axial electron beam with a tunable coma, the electron optical module comprising: an electron lens assembly positioned downstream of an electron source when used in a charged particle system, the electron lens assembly configured to create a tunable lensing effect; a structure positioned downstream of the electron lens assembly when used in a charged particle system, the structure being configured to generate an accelerating or decelerating electric field between the electron lens assembly and the structure; and a micro-lens that is not positioned on the optical axis of the electron lens assembly, and which is configured to apply a lensing effect to an off-axial election beam that does not travel along the optical axis of the electron lens assembly, wherein first aberrations applied to the off-axial electron beam by the micro-lens combine with second aberrations applied by the electron lens assembly such that a coma of the off-axial beam has a desired value in a plane downstream of the electron module.

A1.01. The electron optical module of paragraph A1, wherein the electric field generated by the structure is a decelerating electric field.

A1.02. The electron optical module of paragraph A1, wherein the electric field generated by the structure is an accelerating electric field.

A1.03. The electron optical module of any of paragraphs A1-A1.02, wherein the electron lens assembly comprises at least two electrodes.

A1.04. The electron optical module of any of paragraphs A1-A1.03, wherein the electron lens assembly comprises a combination of rotationally symmetric or segmented electrodes and/or multipoles.

A1.05. The electron optical module of any of paragraphs A1-A1.04, wherein the electron lens assembly comprises a combination of electrostatic and magnetic lenses.

A1.1. The electron optical module of any of paragraphs A1-A1.05, wherein the micro-lens has a positive spherical aberration ($C_S$) and the electron lens assembly has a negative spherical aberration.

A1.1.1. The electron optical module of paragraph A1.1, wherein the combined contribution of the spherical aberration of the electron lens assembly and the off-axial aberration of the micro-lens cause the off-axial electron beam to have no spherical aberration and/or no off-axial aberration in a plane downstream of the electron lens when used in a charged particle system.

A1.2. The electron optical module of any of paragraphs A1-A1.1.1, wherein the electron lens assembly further has a negative coma.

A1.2.1. The electron optical module of paragraph A1.2, wherein the combined contribution of the coma of the electron lens assembly and the coma of the micro-lens cause the off-axial electron beam to have no coma in a plane downstream of the electron lens when used in a charged particle system.

A1.3. The electron optical module of any of paragraphs A1-A1.2.1, wherein the electron lens assembly further has a tunable astigmatism.

A1.3.1. The electron optical module of paragraph A1.3, wherein the combined contribution of the astigmatism of the electron lens assembly and the astigmatism of the micro-lens cause the off-axial electron beam to have no astigmatism in a plane downstream of the electron lens when used in a charged particle system.

A1.4. The electron optical module of any of paragraphs A1-A1.3.1, wherein the electron lens assembly further has a negative field curvature.

A1.4.1. The electron optical module of paragraph A1.4, wherein the combined contribution of the field curvature of the electron lens assembly and the field curvature of the micro-lens cause the off-axial electron beam to have no field curvature in a plane downstream of the electron lens when used in a charged particle system.

A1.5. The electron optical module of any of paragraphs A1-A1.4.1, wherein the electron lens separates the electrons passing through the electron lens assembly according to energy.

A1.5.1. The electron optical module of paragraph A1.5, wherein the electron lens separates the electrons passing through the electron lens assembly based on the chromatic aberration of the electron lens.

A1.6. The electron optical module of any of paragraphs A1-A1.5, wherein the spherical aberration coefficient (Cs) and/or chromatic aberration coefficient (Cc) of the lens are tunable to be positive, negative or zero.

A1.7. The electron optical module of any of paragraphs A1-A1.6, wherein the electron lens assembly creates a virtual image.

A1.8. The electron optical module of any of paragraphs A1-A1.7, wherein the electron lens assembly does not create a real image.

A2. The electron optical module of any of paragraphs A1-A1.8, wherein the structure can obstruct the passage of electrons along the optical axis of the electron lens assembly.

A2.1. The electron optical module of paragraph A2, wherein the structure is an aperture plate A2.1.1. The electron optical module of paragraph A2.1, wherein the micro-lens is an aperture defined by the aperture plate.

A2.1.2. The electron optical module of paragraph any of paragraphs A2.1-A2.1.1, wherein the micro-lens comprises multipole apertures.

A2.1.2.1. The electron optical module of paragraph A2.1.2, wherein the micro-lens comprises an Einzel lens.

A2.1.3. The electron optical module of paragraph any of paragraphs A2.1-A2.1.2.1, wherein the micro-lens comprises a stack of small MEMS and/or non-MEMS multipoles.

A2.2. The electron optical module of any of paragraphs A2-A2.1.3, wherein the structure physical can obstruct the passage of electrons along the optical axis of the electron lens.

A2.2.1. The electron optical module of paragraph A2.2, wherein the structure is electrically conductive.

A2.3. The electron optical module of any of paragraphs A2-A2.2.1, wherein the structure comprises a thin film.

A2.3.1. The electron optical module of paragraph A2.3, wherein the structure is a foil.

A2.3.2. The electron optical module of paragraph A2.3, wherein the structure comprises a silicone membrane.

A2.4. The electron optical module of any of paragraphs A2-A2.3.2, wherein the charge held when the monochromator is in use is located on the optical axis of the electron lens assembly.

A2.4.1. The electron optical module of paragraph A2.4, wherein the charge is a negative charge.

A2.4.2. The electron optical module of any of paragraphs A2.4-A2.4.1, wherein the charge held on the optical axis of the electron lens assembly is charge built up by electrons striking the structure.

A2.5. The electron optical module of any of paragraphs A1-A2.4.2, wherein the structure being configured to hold a charge comprises a charge being present on the surface of the structure along the optical axis of the lens assembly.

A3. The electron optical module of any of paragraphs A1-A2.5, wherein the micro-lens is a micro-aperture in the structure.

A3.1. The electron optical module of paragraph A3, wherein the micro-aperture provides a lensing effect using MEMS technology.

A3.2. The electron optical module of any of paragraphs A3-A3.1, wherein the micro-aperture is a first aperture, and the structure further defines a second aperture positioned more proximate to the central axis of the lens assembly than the first aperture.

A3.2.1. The electron optical module of paragraph A3.2, wherein the second aperture allows a second electron beam to pass through the structure.

A3.2.1.1. The electron optical module of paragraph A3.2.1, wherein the second aperture reduces the charge built up on the structure at the optical axis of the lens assembly.

A3.3. The electron optical module of any of paragraphs A3-A3.2.1.1, wherein the micro-lens is one of a plurality of micro-apertures in the structure, each configured to allow an electron beamlet to pass through the structure.

A3.3.1. The electron optical module of paragraph A3.3, wherein individual micro-apertures of the plurality of micro-apertures in the structure have different sizes.

A3.3.1.1. The electron optical module of paragraph A3.3.1, wherein a user can select different dispersion rates by selecting an individual micro-aperture of a desired size.

A4. The electron optical module of any of paragraphs A1-A3.3.1.1, wherein the lens assembly is rotationally symmetric.

A4.1. The electron optical module of paragraph A4, wherein the lens assembly comprises an extractor electrode; first electrodes; and second electrodes.

A4.2. The electron optical module of any of paragraphs A4-A4.1, wherein the lens assembly produces a virtual image in front of an electron emitter when used in a charged particle system.

A4.3. The electron optical module of any of paragraphs A4-A4.2, wherein the optical parameters of the lens assembly are tuned to compensate for the micro-lens' contribution to the off-axial electron beam of one or more of: spherical aberration; coma, field curvature; and astigmatism.

A4.3.1. The electron optical module of paragraph A4.3, wherein tuning the optical parameters of the lens assembly corresponds to adjusting one or more of the size, design, and voltages applied for individual lens assembly components such that one or more of the spherical aberration, coma, field curvature; and astigmatism of the lens assembly is the negative value of the spherical aberration, coma, field curvature; and astigmatism of the micro-lens.

A5. The electron optical module of any of paragraphs A1-A4.3.1, further including an electron source positioned upstream of the lens assembly when the electron lens is used in a charged particle system.

A6. The electron optical module of paragraph of any of A1-A5, wherein the electron optical module is a component element of a monochromator.

A6.1. The electron optical module of paragraph A6, wherein the monochromator comprises: the electron optical module; and an additional optical component positioned downstream of the electron optical module when used in a charged particle system.

A6.1.1. The electron optical module of paragraph A6.1, wherein there is no spherical aberration at all in the off-axial electron beam at the optical component plane.

A6.1.2. The electron optical module of any of paragraphs A6.1-6.1.1, wherein there is no coma at all in the off-axial electron beam at the optical component plane.

A6.1.3. The electron optical module of any of paragraphs A6.1-6.1.2, wherein there is no field curvature at all in the off-axial electron beam at the optical component plane.

A6.1.4. The electron optical module of any of paragraphs A6.1-6.1.3, wherein there is no aberration at all in the off-axial electron beam at the optical component plane.

A6.2. The electron optical module of any of paragraphs A6.1-6.1.4, wherein the optical component comprises a lens.

A6.3. The electron optical module of any of paragraphs A6.1-6.2, wherein the optical component comprises a slit.

A6.3.1. The electron optical module of paragraph A6.3, wherein the slit allows portions of the off-axial electron beam having a desired energy range, and blocks portion of the off-axial electron beam having an energy outside of the desired energy range.

A6.3.2. The electron optical module of any of paragraphs A6.3-A6.3.1, wherein the is configured to selectively allows portions of the off-axial electron beam having selected energy range.

A6.4. The electron optical module of any of paragraphs A6.1-6.3.2, wherein the optical component comprises a deflector.

A6.4.1. The electron optical module of paragraph A6.4, wherein the deflector deflects the off-axial beam so that it becomes an axial beam downstream of the deflector.

A6.5. The electron optical module of any of paragraphs A6.1-6.4, wherein the off-axial electron beam is focused in the optical component plane.

A6.6. The electron optical module of any of paragraphs A6.1-6.5, wherein the optical component plane is perpendicular to the optical axis of the lens assembly A7. The electron optical module of paragraph of any of A1-A6.6, wherein the electron lens is a component element of a coma corrector.

A7.1. The electron optical module of paragraph A7, wherein the coma corrector corrects for coma in the electron beam of a charged particle system.

B1. A charged particle device, comprising: an electron source configured to emit electrons towards a electron optical module; the electron optical module for providing an off-axial electron beam with a tunable coma of any of paragraphs A1-A7.1; an optical column configured to focus the off-axial electron beam to be incident onto a sample; a sample holder configured to hold a sample; and a charged particle detector system configured to detect emissions and/or electrons result and from the off-axial electron beam being incident on the sample.

C1. Use of the electron optical module for providing an off-axial electron beam without spherical aberration of any of paragraphs A1-A7.1.

D1. Use of the charged particle device of paragraph B1.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "determine," "identify," "produce," and "provide" to describe the disclosed methods. These terms are high-level abstractions of the actual operations that are performed. The actual operations that correspond to these terms will vary depending on the particular implementation and are readily discernible by one of ordinary skill in the art.

What is claimed is:

1. An electron optical module for providing an off-axial electron beam with a tunable coma, the electron optical module comprising:
    an electron lens assembly positioned downstream of an electron source when used in a charged particle system, the electron lens assembly configured to create a tunable lensing effect;
    a structure positioned downstream of the electron lens assembly when used in a charged particle system, the structure being configured to generate a decelerating electric field between the electron lens assembly and the structure; and
    a micro-lens that is not positioned on the optical axis of the electron lens assembly, and which is configured to apply a lensing effect to an off-axial election beam that does not travel along the optical axis of the electron lens assembly, wherein first aberrations applied to the off-axial electron beam by the micro-lens combine with second aberrations applied by the electron lens assembly such that a coma of the off-axial beam has a desired value in a plane downstream of the electron module, and wherein the electron lens assembly further has a negative contribution to the spherical aberration ($C_s$) of the off-axial electron beam.

2. The electron optical module of claim 1, wherein:
    the first aberrations are at least partially caused by the electron beam traveling through micro-lens; and
    the second aberrations are at least partially caused by the electron beam traveling not along the optical axis of the electron lens assembly.

3. The electron optical module of claim 1, wherein the first aberrations applied to the off-axial electron beam by the micro-lens combines with second aberrations applied by the electron lens assembly and third aberrations applied by one or more other microscope elements when the electron lens is used in the charged particle system such that the coma of the off-axial electron beam is zero in the plane downstream of the electron lens.

4. The electron optical module of claim 1, wherein the structure is configured to have a voltage potential applied to it when the electron optical module is in use, and wherein having the voltage potential applied to the structure causes a charge to be held on the surface of the structure at a point along the optical axis of the electron lens assembly.

5. The electron optical module of claim 1, wherein the position of the structure is such that a body of the structure prevents the passage of electrons along an optical axis of the electron lens assembly.

6. The electron optical module of claim 1, wherein the structure is an aperture plate, and wherein the micro-lens is an aperture defined by the aperture plate.

7. The electron optical module of any claim 6, wherein the micro-aperture is a first aperture that allows a second electron beam to pass through the structure, and the structure further defines a second aperture positioned more proximate to the central axis of the lens assembly than the first aperture.

8. The electron optical module of claim 6, wherein the micro-lens is one of a plurality of micro-apertures in the structure, each configured to allow an electron beamlet to pass through the structure.

9. The electron optical module of claim 6, wherein the structure is configured to have a voltage potential applied to it when the electron optical module is in use, and wherein the voltage applied to the structure causes a decelerating electric field, which causes the aperture to apply a lensing effect to electrons passing through the aperture.

10. The electron optical module of claim 1, wherein the optical parameters of the lens assembly are tuned to compensate for the micro-lens' contribution to the off-axial electron beam of two or more of:
spherical aberration;
coma;
field curvature; and
astigmatism.

11. The electron optical module of claim 10, wherein tuning the optical parameters of the lens assembly corresponds to adjusting one or more of the size, design, and voltages applied for individual lens assembly components such that the contributions of the electron lens assembly to one or more of the spherical aberration, coma, field curvature, and astigmatism combines with the contribution of the micro-lens to one or more of the spherical aberration, coma, field curvature, and astigmatism of the micro-lens such that the off-axial beam has a desired value of one or more of the spherical aberration, coma, field curvature, and astigmatism in one or more planes downstream of the electron lens.

12. The electron optical module of claim 1, wherein the combined contribution of the astigmatism of the electron lens assembly and the astigmatism of the micro-lens cause the off-axial electron beam to have no astigmatism in a plane downstream of the electron lens when used in a charged particle system.

13. The electron optical module of claim 1, wherein the combined contribution of the field curvature of the electron lens assembly and the field curvature of the micro-lens cause the off-axial electron beam to have no field curvature in a plane downstream of the electron lens when used in a charged particle system.

14. The electron optical module of claim 1, wherein the electron lens assembly separates the electrons passing through the electron lens assembly based on the chromatic aberration of the electron lens.

15. The electron optical module of claim 1, wherein the electron lens assembly is a component element of a monochromator that comprises the electron lens assembly, and an additional optical component positioned downstream of the electron lens assembly when used in a charged particle system, the additional optical component comprising:
a body that blocks a first portion of the off-axial electron beam having an energy outside of a desired energy range; and
a slit or aperture that allows portions of the off-axial electron beam having the desired energy range to pass through the additional optical component.

16. The electron optical module of claim 15, wherein the optical component comprises a deflector configured to deflect the off-axial electron beam so that it becomes an axial beam downstream of the deflector.

17. The electron optical module of claim 15, wherein the off-axial electron beam is focused in the plane of the additional optical component.

18. The electron optical module of claim 1, wherein the electron optical module is a component element of a coma corrector, and wherein the coma corrector corrects for coma in the electron beam of a charged particle system.

19. A charged particle device, comprising:
an electron source configured to emit electrons towards an electron optical module;
the electron optical module comprising:
an electron lens assembly positioned downstream of the electron source, the electron lens assembly comprising at least two electrodes configured to create a tunable lensing effect;
a structure positioned downstream of the electron lens, the structure being configured to generate a decelerating electric field between the electron lens assembly and the structure; and
a micro-lens that is not positioned on the optical axis of the electron lens assembly, and which is configured to apply a lensing effect to an off-axial election beam that does not travel along the optical axis of the electron lens assembly, wherein first aberrations applied to the off-axial electron beam by the micro-lens combine with second aberrations applied by the electron lens assembly such that a coma of the off-axial beam has a desired value in a plane downstream of the electron module, and wherein the electron lens assembly further has a negative contribution to the spherical aberration ($C_s$) of the off-axial electron beam;
an optical column configured to focus the off-axial electron beam to be incident onto a sample;
a sample holder configured to hold the sample; and
a charged particle detector system configured to detect emissions and/or electrons result and from the off-axial electron beam being incident on the sample.

* * * * *